United States Patent [19]

Fobbester et al.

[11] Patent Number: 5,157,341
[45] Date of Patent: Oct. 20, 1992

[54] PHASE DETECTOR

[75] Inventors: Ian G. Fobbester, Fairford; David S. Clarke, Blunsdon, both of England

[73] Assignee: Plessey Overseas Limited, England

[21] Appl. No.: 565,065

[22] Filed: Aug. 10, 1990

[30] Foreign Application Priority Data

Aug. 22, 1989 [GB] United Kingdom ................. 8919089

[51] Int. Cl.$^5$ ..................... H03D 13/00; H03K 9/06
[52] U.S. Cl. ..................... 328/133; 328/155; 328/151; 307/262; 307/516; 307/514; 331/1 A; 331/18
[58] Field of Search ............... 328/133, 134, 155, 151; 307/514, 516, 262, 352, 353, 355; 331/1 A, 18, 25, 17

[56] References Cited

U.S. PATENT DOCUMENTS

| 4,216,396 | 8/1980 | Balaban et al. | 328/151 |
| 4,305,040 | 12/1981 | Koide | 328/134 |
| 4,358,736 | 11/1982 | De Boer | 328/151 |
| 4,527,277 | 7/1985 | Kosaka et al. | 307/516 |
| 4,775,811 | 10/1988 | Okano | 328/151 |
| 4,980,653 | 12/1990 | Shepherd | 331/25 |

OTHER PUBLICATIONS

"Frequency Dividers and Synthesisers", Plessey Semiconductors, 1988, pp. 236–245, 306, 312.

Primary Examiner—Timothy P. Callahan
Attorney, Agent, or Firm—Kirschstein, Ottinger, Israel & Schiffmiller

[57] ABSTRACT

A phase detector for a phase locked loop frequency synthesizer, in which frequency-divided signals from a variable frequency oscillator and a reference oscillator are used to trigger respective ramp waveform generators, and a sample pulse generator is arranged to be responsive to the reference ramp waveform to provide sample pulses centered at the mid-point of that ramp waveform to respective sample and hold circuits, the relative phases of the ramp waveforms being determined from the sampled and held voltages.

6 Claims, 4 Drawing Sheets

PHASE DETECTOR

BACKGROUND OF THE INVENTION

1. Field of the Invention

This invention relates to a phase detector, particularly though not exclusively to a phase detector for use in a phase locked loop which may be used in a frequency synthesiser system.

2. Description of Related Art

The phase locked loop frequency synthesiser is a system, as shown in FIG. 1, whereby a variable frequency oscillator 2 can be phase locked by a phase comparator 4 to a fixed and stable reference oscillator 6. By connecting a variable ratio divider 8 between the variable oscillator 2 and the phase detector 4, the phase locked frequency of the variable oscillator 2 can be modified in response to a digital word from a microprocessor 10 or other data source. A reference divider 12 is coupled to the reference oscillator 6. The output of phase detector 4 is coupled via a loop amplifier 14 to control variable frequency oscillator 2.

When a phase locked loop is first switched on, the inputs to the phase detector will not be phase locked or even at similar frequencies, and, therefore, to allow the loop to rapidly acquire lock, a phase detector which is phase and frequency sensitive is desirable. A well known detector as shown in FIG. 2 with the necessary characteristics comprise two flip-flops 20 having their outputs coupled via an AND gate 22 to reset inputs at flip-flops 20. This type of detector produces high or low outputs depending on the phase/frequency relationships of the input pulses, but always attempt to align the input edges for zero phase error once locked. When this condition is achieved there is a non linearity in the transfer characteristic, shown in FIG. 3, which results in the oscillator being uncontrolled in the region of zero phase error.

This disadvantage is often overcome by the addition of an analogue phase detector which is linear in the zero phase error region, but is not capable of pulling the loop into lock from far off as it is not sensitive to frequency. See for example the Plessey NJ8821 series of Frequency Synthesisers, described in pp236-245, 306-312 "Frequency Dividers and Synthesisers", Plessey Semiconductors, 1988. The digital detector is used to achieve rough phase lock, and then an automatic switch-over made to the analogue detector to maintain fine control. A requirement of an analogue phase detector for use in conjunction with a digital detector is that both comparators bring the outputs from the reference and variable frequency oscillators to the same phase relationship to avoid glitches when the switch-over is made. Thus as shown in FIG. 1, phase detector 4 comprises a digital detector 14 and an analog detector 16, the outputs from the detectors being applied to an amplifier 18, provision being made (not shown) for ensuring detectors 14 and 16 do not operate simultaneously.

SUMMARY OF THE INVENTION

It is an object of the invention to provide an improved sample and hold analogue phase detector for use in synthesisers which in addition use a digital phase detector for aligning the edges of pulses from the variable frequency divider and reference divider outputs.

According to the present invention there is provided a phase detector comprising a first ramp generator responsive to a reference oscillator input signal for initiating a first ramp waveform, a second ramp generator responsive to a variable frequency oscillator signal input for initiating a second ramp waveform, the first and second ramp generators being coupled respectively to first and second sample and hold circuits, means responsive to the first ramp waveform to actuate the first and second sample and hold circuits, and comparison means for comparing the signal values stored in the first and second sample and hold circuits whereby to provide an output signal indicative of the phase difference between the reference oscillator and variable frequency oscillator input signals.

As preferred the comparison means is a differential amplifier. The first and second ramp generators are reset in operation in response to their output ramp waveforms and a trigger signal.

BRIEF DESCRIPTION OF THE DRAWINGS

A preferred embodiment of the invention will now be described with reference to the accompanying drawings where.

DETAILED DESCRIPTION OF THE PREFERRED EMBODIMENT

Figure 4:
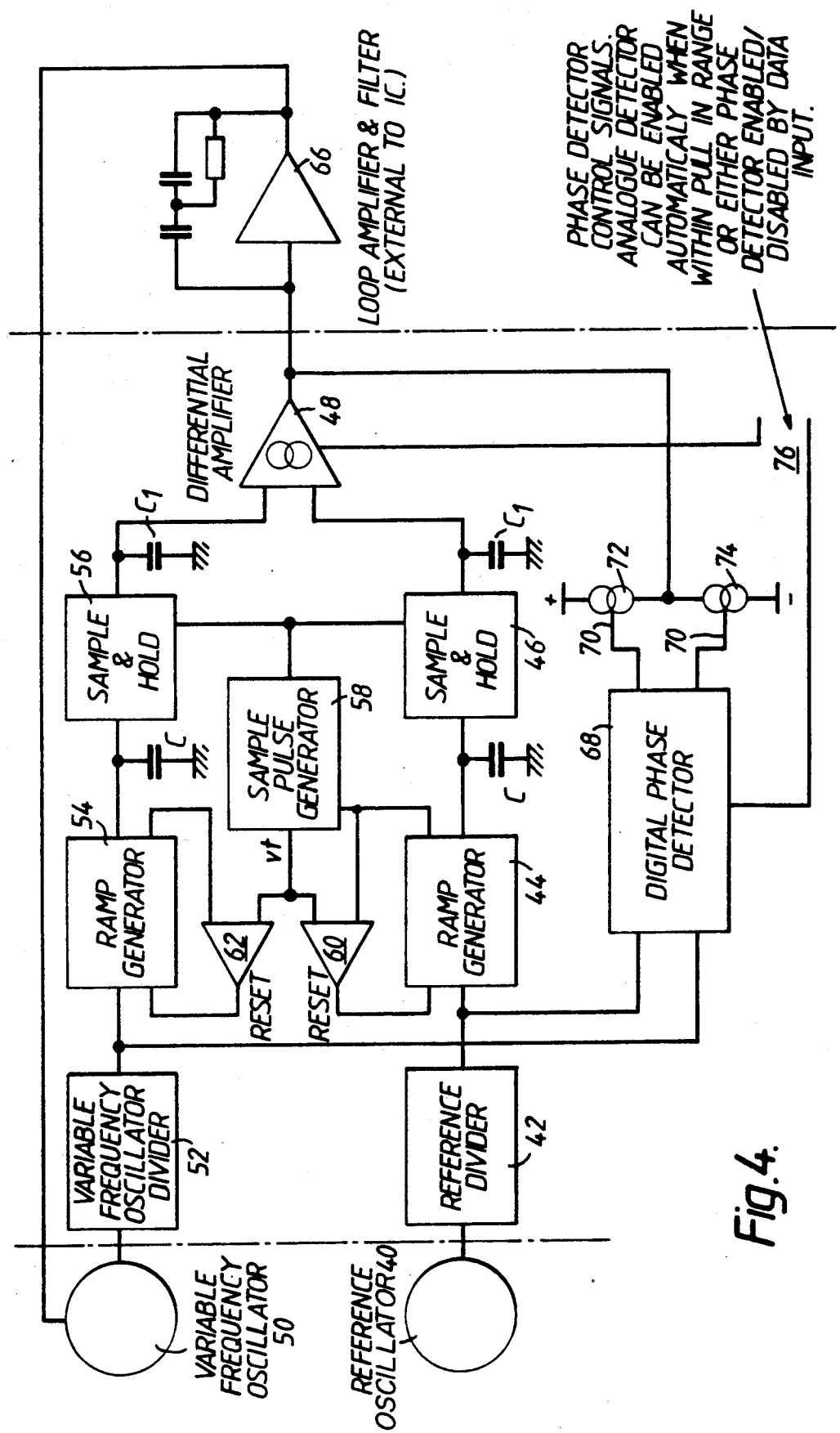
FIG. 4 is a circuit diagram of an analogue phase detector in accordance with the invention; and, FIG. 5 is a set of waveform diagrams A-E illustrating the operation of the circuit of FIG. 4.

Referring now to FIG. 4, there is shown a phase detector according to the invention fabricated on an integrated circuit. The phase detector comprises a reference oscillator 40 coupled via a reference divider chain 42 to a first ramp generator 44 whose output is stored in a capacitor C and fed to a first sample and hold circuit 46 having a storage capacitor C1. This is coupled to a first input of a differential amplifier 48. A variable frequency oscillator 50 is coupled via a divider chain 52 to a second ramp generator 54 whose output is stored in a capacitor C and fed to a second sample and hold circuit 56 having a storage capacitor C1, the stored signal from the sample and hold circuit 56 being applied to a second input of differential amplifier 48. The output of amplifier 48 which is a current signal is fed back to the variable frequency oscillator 50 to provide phase lock loop control, via a loop amplifier and filter 66, which is external to the integrated circuit.

The output of first ramp generator 44 is fed to sample pulse generator 58 which provides pulses for triggering sample and hold circuits 46, 56 and also for triggering reset amplifiers 60, 62 which are responsive to the ramp waveforms from generators 44, 54 to reset the respective ramp generators.

Figure 1:
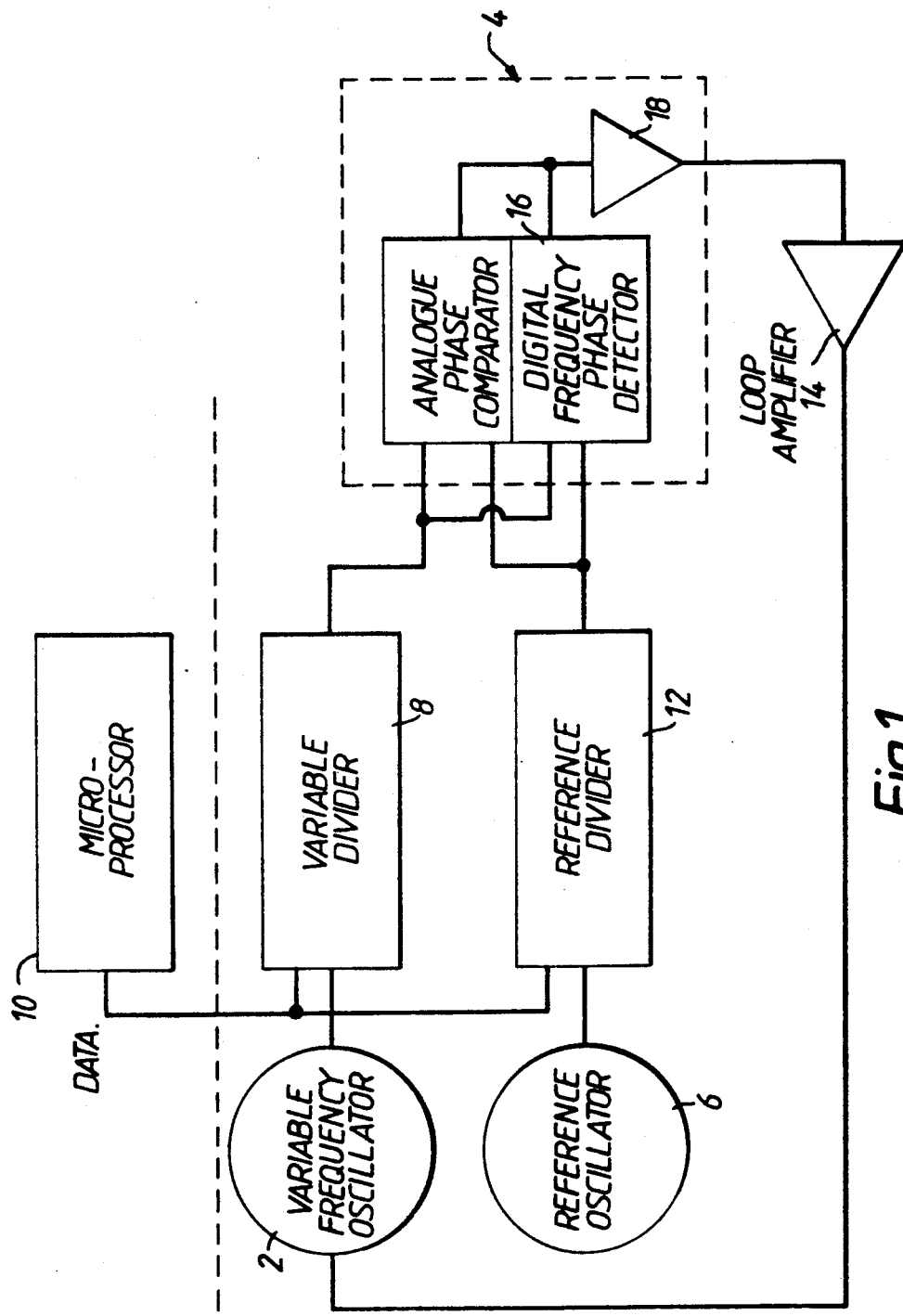
FIG. 1 is a schematic view of a standard form of phase lock loop according to the prior art.
Figure 2:
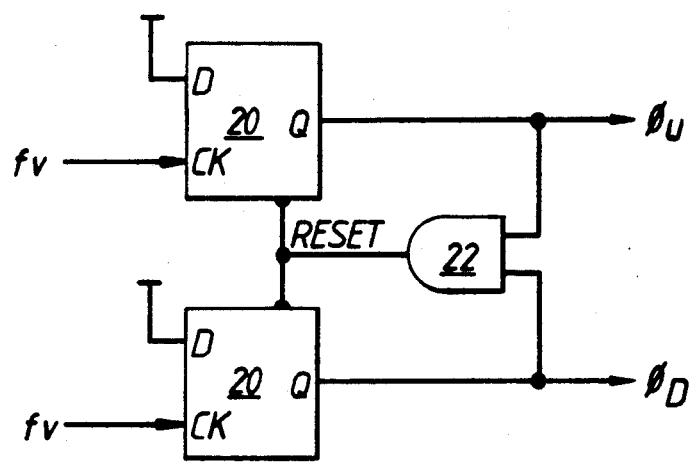
FIG. 2 is a schematic diagram of a known form of digital frequency/phase detector for use with the present invention.
Figure 3:
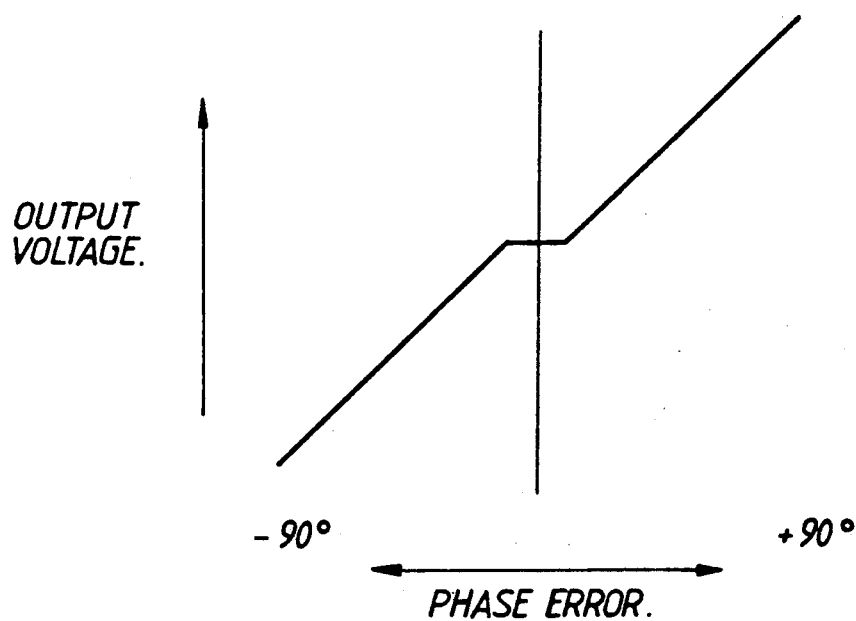
FIG. 3 is a graph indicating the output characteristic of the digital phase detector of FIG. 2.

In addition to the analog phase detector, a digital frequency/phase detector 68 is incorporated on the integrated circuit, the detector 68 being of a construction of the type shown in FIG. 2. The outputs 70 of phase detector 68 control current sources 72, 74 to provide an appropriate current signal value to loop amplifier 66. Phase detector control signal lines 76 are provided to selectively actuate the digital or analog phase detectors, or to automatically switch in the analog phase detector where a predetermined degree of lock has been achieved. Since the outputs of both phase detectors are current values, the outputs may simply be added together at the node provided at the virtual earth input of amplifier 66.

Thus in operation of the circuit of FIG. 4 the front edge of the outputs from the reference and variable frequency oscillator dividers 42, 52, each initiate a linear ramp waveform which continues until a fixed level is reached. At this point the ramps are re-set by a level sensitive trigger circuit 60, 62. The ramps are generated by discharging capacitors C of equal value with equal currents and therefore, the ramps are of equal amplitude and duration.

Figure 5:
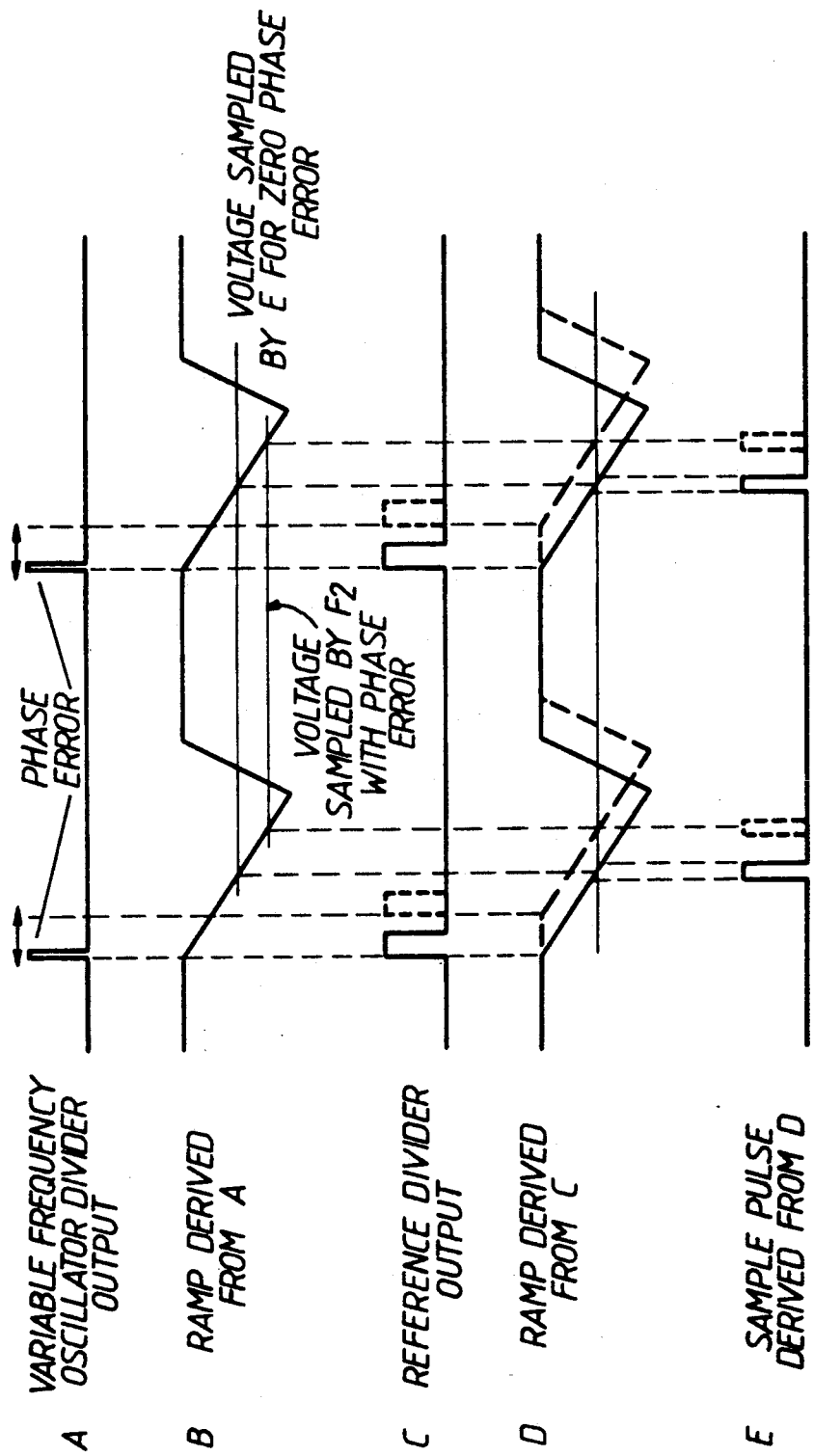

A timing diagram showing the waveforms is shown in FIG. 5. A sample pulse is generated at 58 (waveform E) from the reference ramp 44 (waveform D) using a level sensitive trigger circuit and produces a pulse which is centered on the mid point of the ramp. The sample and hold circuits will store the ramp voltage present on the ramp capacitor C on the sample and hold capacitors C1 at the time this sample pulse is generated. Since the sample pulse is derived from the reference counter ramp generator 44, the voltage at the reference sample and hold capacitor C1 will always be half the reference ramp voltage. The voltage at the variable frequency oscillator sample and hold capacitor will depend on the phase relationship between the two ramp generators, but will again be half the ramp voltage or equal to that on the reference sample and hold if the two ramps are exactly in phase.

The difference in voltage between the two sample and hold outputs is amplified by the differential amplifier 48 whose output provides the control voltage signal for the variable frequency oscillator.

The advantages of the circuit shown in FIG. 4 are as follows:

1. The use of identical ramps on the reference and variable oscillator sides enables an analogue phase detector design with zero phase error identical to that of a standard digital design as shown in FIG. 2. A switch between the two types can be made without a change in phase relationships between the reference and variable oscillator being required.

2. The use of dual sample and hold circuits and a differential amplifier removes phase noise introduced in the generation of the sample pulse from the reference ramp. This noise appears equally on both sample and hold outputs and is therefore, rejected by the differential amplifier.

3. The balanced arrangement of sample and hold circuits on both reference and variable oscillator sides ensures that any switching energy transferred from the sampling system to the sample and hold capacitors will be common to both sides and therefore, rejected by the differential amplifier.

4. Any droop on the sample and hold capacitors during the hold period will be similar on both sides and therefore, rejected by the differential amplifier. This feature and that from (3) mentioned previously, eases the design of the sample and hold circuit in terms of leakage currents and coupling effects from the sample pulse compared with single ended designs. In turn the reduction in these effects reduces the level of sample frequency sidebands in the synthesised oscillator.

We claim:

1. A phase detector comprising a first ramp generator responsive to a reference oscillator input signal for initiating a first ramp waveform, a second ramp generator responsive to a variable frequency oscillator signal input for initiating a second ramp waveform, the first and second ramp generators being coupled respectively to first and second sample and hold circuits, means responsive to the first ramp waveform to actuate the first and second sample and hold circuits, and comparison means for comparing the signal values stored in the first and second hold circuits whereby to provide an output signal indicative of the phase difference between the reference oscillator and variable frequency oscillator input signals.

2. A phase detector according to claim 1 wherein the actuating means for the sample and hold circuits comprise a sample pulse generator arranged to generate a sample pulse at the mid-point of the first ramp waveform.

3. A phase detector as claimed in claim 2 wherein said sample pulse generator is arranged to provide reset signals to said first and second ramp generators.

4. A phase detector according to claim 1 wherein the comparison means comprises a differential amplifier providing a current signal output.

5. A phase detector according to claim 3 in combination with a digital phase/frequency detector coupled to receive said reference oscillator input signal and said variable frequency oscillator input signal to provide a current signal output which is summed with the output of said differential amplifier.

6. A phase detector as claimed in claim 1 including a reference oscillator and a reference divider chain for providing said reference oscillator input signal, and a variable frequency oscillator and a variable frequency oscillator divider chain for providing said variable frequency oscillator input signal.

* * * * *